United States Patent [19]

Enomoto et al.

[11] Patent Number: 5,128,667

[45] Date of Patent: Jul. 7, 1992

[54] WIRELESS REMOTE CONTROLLER FOR OUTPUTTING IN SERIATIM AN OPERATION MODE SIGNAL FOR EACH OF A PLURALITY OF RECEIVING DEVICES

[75] Inventors: Masahiro Enomoto, Inagi; Takao Ito, Yokosuka; Takeshi Nakanishi, Shizuoka, all of Japan

[73] Assignee: Molex Incorporated, Lisle, Ill.

[21] Appl. No.: 701,237

[22] Filed: May 16, 1991

[30] Foreign Application Priority Data

Apr. 12, 1989 [JP] Japan .................................. 1-42916

[51] Int. Cl.⁵ .............................................. H04B 7/00
[52] U.S. Cl. .......................... 340/825.72; 358/194.1; 359/146
[58] Field of Search .............. 340/825.69, 825.72; 358/194.1; 359/142, 145, 146

[56] References Cited

U.S. PATENT DOCUMENTS 4,703,359 10/1987 Rumbolt et al. ............... 340/825.72

Primary Examiner—Donald J. Yusko
Assistant Examiner—Dervis Magistre
Attorney, Agent, or Firm—Stephen Z. Weiss

[57] ABSTRACT

An improved wireless remote controller for controlling each of several devices under control in each mode of operation without requiring any switching among devices under control and thus having no device switching key mounted thereon. The wireless remote controller has a plurality of operation selection keys and is designed to operate in such manner that when the controller is directed toward one of the devices under control and any one of the operation mode selection keys is depressed, a corresponding operation mode signal is generated and transmitted to a device under control. The operation mode signal includes a series of consecutive signal components for operating all the devices under control. The device under control responds only to the associated one of the signal components of the operation mode signal.

7 Claims, 2 Drawing Sheets 5,128,667

WIRELESS REMOTE CONTROLLER FOR OUTPUTTING IN SERIATIM AN OPERATION MODE SIGNAL FOR EACH OF A PLURALITY OF RECEIVING DEVICES

CROSS-REFERENCE TO RELATED APPLICATION

This application is a continuation-in-part of U.S. patent application Ser. No. 507,326, filed Apr. 10, 1990, now abandoned.

FIELD OF THE INVENTION

The present invention relates to a wireless remote controller and more particularly, to a new and improved remote controller capable of remote controlling each of several devices under control into each mode of operation without requiring any switching operation for switching among said devices under control.

PRIOR ART

As is well know, a number of wireless remote controllers have been widely utilized for both industrial and household applications. For example, in the household application, the controllers for controlling several electric devices such as television sets, video devices, doors, curtains, lights, air conditioners, audio devices, car doors and the like have been provided. On the other hand, in the industrial application, the controllers for controlling automatic machines, robots and production lines have also been provided.

In the early time, with reference to the field of television sets, because there were different types of television sets manufactured by, for example, companies A, B and C, the corresponding number of types of wireless remote controllers that are suitable for specifications of A, B and C companies, respectively, were also provided and each type of the controllers was exclusively used with the corresponding type of television set.

Accordingly there has existed an economical inconvenience from both manufacturer and user sides in that the manufactures of the remote controllers should produce the different types of controllers corresponding to all types of television sets and the users should replace the controllers by new ones when they change the types of television sets.

However a wireless remote controller having a device switching key capable of switching among the television sets was recently developed and marketed. In order to more clearly understand the present invention, the prior art arrangement of the remote controller of this type will briefly be described with reference to FIG. 2.

In FIG. 2, a numeral 1' represents a remote controller of the prior art; a numeral 2' represents a plurality of operation mode selection keys; a numeral 3' represents a power switch key; a numeral 4' represents a device switching key for switching among several devices under control (briefly represented for the sake of clarity); a numeral 5' represents a television set made by a company A; a numeral 6' represents another television set made by a company B; and a numeral 7' represents a further television set made by a company C.

Operation of the remote controller 1' is described below by way of example. At first the device switching key 4' for switching among the devices under control is depressed to select the television set 5' made by the company A. Then the power switch key 3' is depressed to generate an operation mode signal selected by the oscillator section, namely, a POWER ON or OFF operation mode signal A' suitable for the television set 5' made by the company A, thereby effecting POWER ON or OFF operation of the television set 5'. Thereafter when any one of the operation mode selection keys is depressed, the operation mode signal in compliance with the specification of the television set 5' made by the company A is generated from the remote controller 1'. On the other hand when the controller 1' is to be used for controlling the television set 6' and 7' made by the companies B and C, respectively, the device switching key 4' is again depressed to select the desired television set. Then when the power switch key 3' is depressed, the POWER ON or OFF operation mode signals 8' and C' suitable for the television sets 6' and 7' made by the companies B and C, respectively, are generated.

As described above, the wireless remote controller of the prior art can satisfactorily be used to control a plurality of devices under control and therefore can find a wide range of applications. Unfortunately the remote controller of the prior art may not provide the reliable results depending upon the control condition of the devices under control.

For example, in case where said prior art controller is used for controlling several devices under control into each mode of operation, and more specifically, in case where a frequent switching operation among the devices under control must be effected, and there is a short time interval between the switching operations of the devices under control, then the switching operations become cumbersome to execute and sometimes may cause a switching error. By way of example, assuming that there are three lights installed in a room and it is always required to operate these lights in such a manner that one of the lights is turned ON and others are turned OFF, then it becomes expensive to provide three remote controllers, one for each light, as in the previous arrangement. The prior art remote controller having the device switching key as stated above can preferably be used in such circumstances. Nevertheless there still remains the problem of cumbersome switching operations depending upon the switching frequency as stated above.

Although typical applications of the remote controller have been described above, it is to be noted that there remains the same problem in other devices under control, such as video devices, industrial products and the like.

SUMMARY OF THE INVENTION

In view of the foregoing, it is an object of the present invention to provide an improved remote controller capable of controlling a plurality of devices under control without the use of a device switching key for switching among the devices under control.

More specifically when any one of a plurality of operation mode selection keys, for example, a power switch key on the remote controller is depressed, a POWER ON or OFF operation mode signal constituted by a series of consecutive signal components for operating all of the devices under control is generated and transmitted by the remote controller. It is important that upon depression of one of the operation mode selection keys, no simultaneous, but consecutive, generation of the signal components constituting the operation mode signal is effected.

In order to achieve the above object, the present invention provides a wireless remote controller having a plurality of operation mode selection keys 2 and designed to operate in such manner that when any one of the operation mode selection keys is depressed, a corresponding operation mode signal is produced and transmitted to a device under control which is then put into operation in the mode selected by the key characterized in that:

the operation mode signal is constituted by a series of consecutive signal components A, B and C each of which renders the associated one of several devices under control 4, 5 and 6 to be operated in the mode selected by the key;

a single key operation of any one of the operation mode selection keys effects to produce and transmit the operation mode signal for operating all the devices under control 4, 5 and 6; and during the time the operation mode signal is transmitted, the associated one of the signal components A, B and C of the operation mode signal is selectively received by each of the devices under control 4, 5 and 6.

According to the arrangement as described above, when the remote controller is directed toward one of the devices under control 4, 5 or 6 and one of the plurality of operation mode selection keys 2, for example, a power switch key 3 is depressed, a series of consecutive signal components A, B and C for turning ON or OFF the devices under control 4, 5 and 6, respectively, is sequentially generated.

Each of the devices under control 4, 5 and 6 responds only an associated one of the consecutive components A, B and C. More specifically the device under control 4 responds only to the signal component A; the device under control 5 responds only to the signal component B; and the device under control 6 responds only to the signal component C. Therefore each of the devices under control are put into the operation in the mode selected by a mode selection key. The arrangement according to the present invention is useful in a case where high frequency switching among the plurality of devices under control is required.

BRIEF DESCRIPTION OF THE DRAWINGS

The present invention will now be described with reference to the accompanying drawings in which.

DESCRIPTION OF THE PREFERRED EMBODIMENT

Figure 1:
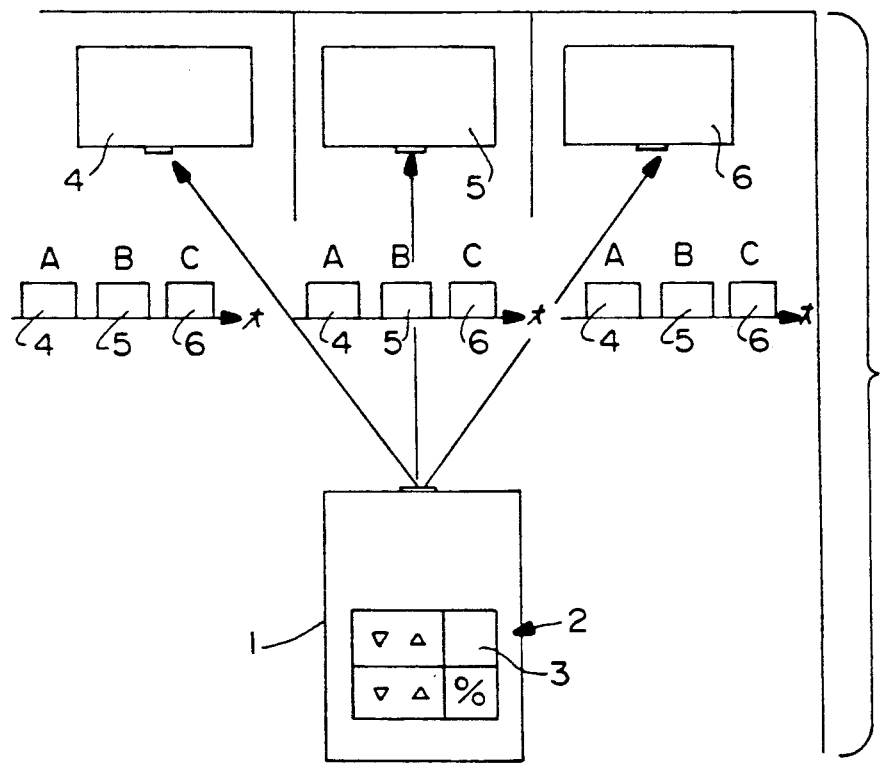
FIG. 1 is a schematic view of a wireless remote controller in accordance with the present invention.
Figure 2:
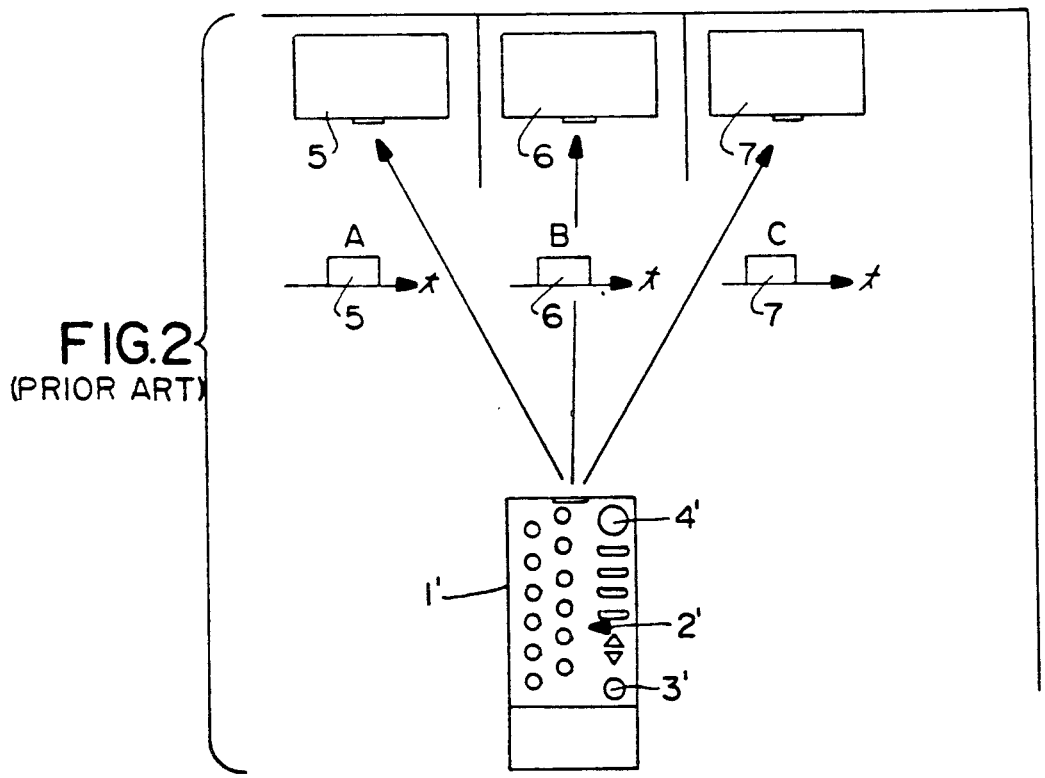
FIG. 2 is a schematic view of a prior art wireless remote controller.

Referring now to FIG. 1, a numeral 1 represents a wireless remote controller according to the present invention and a numeral 2 represents a plurality of operation mode selection keys. Assuming that the devices under control are television sets, the operation mode selection keys include a channel forward operation mode selection key, a channel reverse operation mode selection key, a volume increment operation mode selection key, a volume decrement operation mode selection key, a TV/VTR operation mode selection key, a power switching operation mode key and the like. A numeral 3 represents the power switching operation mode key. The remote controller 1 presents a low profile card shape.

The remote controller is designed for controlling the plurality of devices under control 4, 5 and 6. It is assumed, herein, that the devices under control are constituted by television sets 4, 5 and 6 made by companies A, B and C, respectively.

The remote controller 1 in addition to the plurality of operation mode selection keys 2 may include other readily available off the shelf components such as a read only memory (ROM) for storing common operation mode signals for the devices 4, 5 and 6, a microprocessor under control of a stored program for detecting depression of an operation mode key and for selectively accessing and retrieving the common operation mode signals stored in the ROM in response to the depressed key, and an infrared light emitting diode (LED) with an associated drive circuit connected to an output port of the microprocessor for transmitting the operation mode signals retrieved from the ROM. A wireless remote control unit utilizing components identified above is shown and described in U.S. Pat. No. 4,703,359.

The remote controller is arranged such that when any one of the operation mode selection keys is depressed, the common corresponding common operation mode signal is generated and transmitted. The common operation mode signal is defined as follows:

1) When the power switching operation mode selection key 3 is depressed, then the remote controller generates and transmits the common operation mode signal having a series of consecutive signal components A, B and C each of which turns ON or OFF the associated one of the television sets 4, 5 and 6;

2) In the same manner, when the channel forward or reverse operation mode selection key, the volume increment or decrement operation mode selection key, or the TV/VTR operation mode selection key is depressed, then the remote controller generates and transmits the common operation mode signal having a series of consecutive signal components A, B and C each of which renders the associated one of the television sets 4, 5 and 6 to be operated in the mode selected by the key.

3) The consecutive signal components each constituted by a 12 bit code of logical 'H' and 'L' states are shown in Table 1 below. The 12 bit code is defined and programmed in such a manner that the logical 'H' bit is provided by a longer time interval of 1.2 msec and the logical 'L' bit is provided by a shorter time interval of 0.6 msec. There is a spacing of 0.6 msec between the adjacent bits.

TABLE 1

| Names of keys Operation Mode | Operation Mode Signal for First Device under Control 4 Bits | | | | | | | | | | | |
| --- | --- | --- | --- | --- | --- | --- | --- | --- | --- | --- | --- | --- |
| | 1 | 2 | 3 | 4 | 5 | 6 | 7 | 8 | 9 | 10 | 11 | 12 |
| Channel Forward | L | L | L | L | L | L | L | H | L | L | L | L |
| Channel Reverse | H | L | L | L | L | L | L | H | L | L | L | L |
| Volume Increment | L | H | L | L | L | L | L | H | L | L | L | L |
| Volume Decrement | H | H | L | L | L | L | L | H | L | L | L | L |
| TV/VTR | L | L | H | L | L | L | L | H | L | L | L | L |
| Power Switching | H | L | H | L | L | L | L | H | L | L | L | L |

TABLE 1-continued

| Names of keys Operation Mode | Operation Mode Signal for Second Device under Control 5 Bits | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Channel Forward | L | H | H | L | L | L | L | H | L | L | L | L |
| Channel Reverse | H | H | H | L | L | L | L | H | L | L | L | L |
| Volume Increment | L | L | L | H | L | L | L | H | L | L | L | L |
| Volume Decrement | H | L | L | H | L | L | L | H | L | L | L | L |
| TV/VTR | L | H | L | H | L | L | L | H | L | L | L | L |
| Power Switching | H | H | L | H | L | L | L | H | L | L | L | L |

| Names of keys Operation Mode | Operation Mode Signal for Third Device under Control 6 Bits | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Channel Forward | L | L | L | L | H | L | L | H | L | L | L | L |
| Channel Reverse | H | L | L | L | H | L | L | H | L | L | L | L |
| Volume Increment | L | H | L | L | H | L | L | H | L | L | L | L |
| Volume Decrement | H | H | L | L | H | L | L | H | L | L | L | L |
| TV/VTR | L | L | H | L | H | L | L | H | L | L | L | L |
| Power Switching | H | L | H | L | H | L | L | H | L | L | L | L |

The definition of the code stated above is only for the purpose of illustration and a different type of code may be used instead therefor. It is only necessary that the individual signal components for controlling the different devices under control can be distinguished from each other.

If desired, an identifier bit may be inserted into the operation mode signal between the individual signal components for controlling the different devices under control.

Operation of the remote controller according to the present invention will be described below:

Assuming that the remote controller 1 is directed toward one of the television sets 4 and one specific key, for example, the power switching key 3 among the plurality of common operation mode selection keys 2 is depressed, then the power switching common operation mode signal constituted by the series of consecutive signal components A, B and C for turning ON or OFF the associated ones of the television sets 4, 5 and 6 is generated and transmitted by the remote controller. The television set 4 responds only the signal component A among the consecutive signal components A, B and C of the power switching common operation mode signal and is turned ON or OFF thereby. The television set 4 does not respond to other signal components B and C of the power switching operation mode signal.

In order to turn ON or OFF the other television sets 5 and 6, it is only necessary that the remote controller 1 is directed toward either of these television sets and the power switching common operation mode selection key 3 is again depressed. Then the power switching common operation mode signal constituted by the series of consecutive signal components A, B and C as stated above is again generated and the associated one of the signal components is received by either of the television sets which is then turned ON and OFF.

The same operation can also be applied relative to other common operation mode selection keys.

It is apparent from the foregoing that according to the present invention one remote controller can be used for controlling a plurality of devices in various modes of operation without use of the device switching key for switching among the devices under control as in the prior arrangement. Therefore the remote controller according to the present invention is most suitable for circumstances requiring frequent switching operation among several devices.

More specifically a single key operation of any one of the common operation mode selection keys generates the common operation mode signal constituted by the series of consecutive signal components for operating all the devices under control, thereby achieving highly efficient remote control operation therefor.

Figure 3:
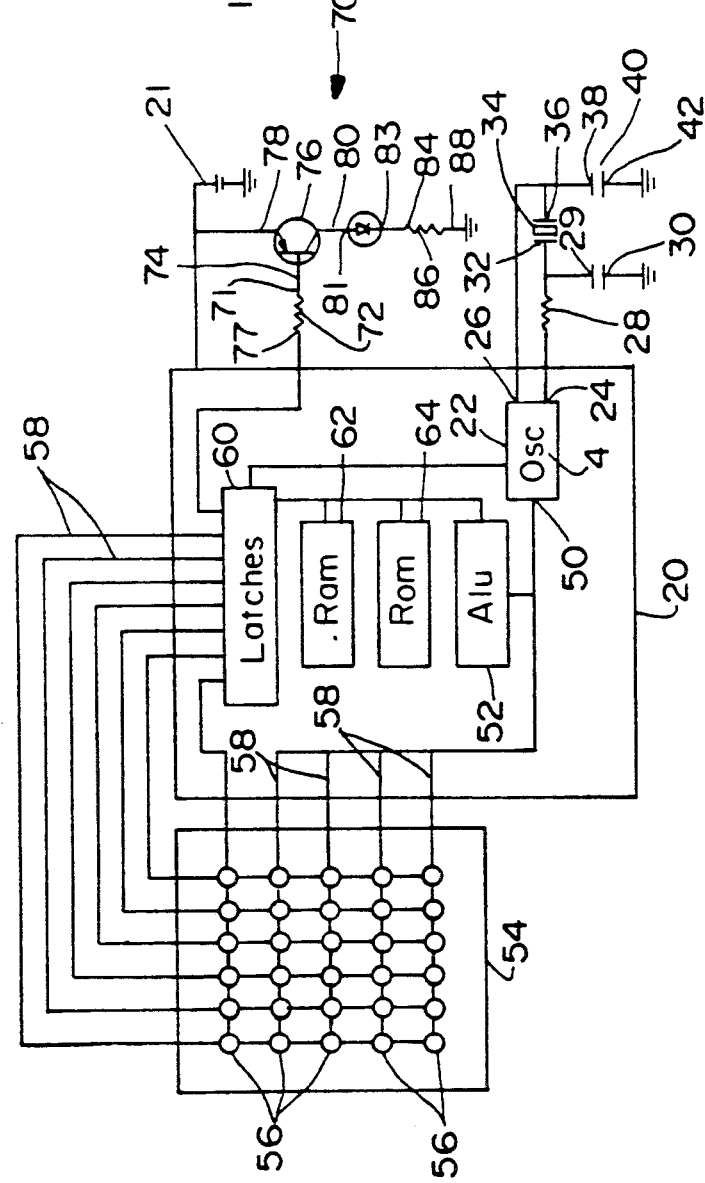
FIG. 3 is a block diagram of the control circuit of the controller of FIG. 1.

As seen in FIG. 3, a microprocessor 20 powered by a voltage source 21 is the control unit for the remote controller 1. The timing of the microprocessor 20 is controlled by an oscillator 22 having two input terminals 24, and 26. One input terminal 24 is connected to a resistor 28 which is connected to a terminal 29 of a capacitor 30 and a terminal 32 of a crystal 34. A second terminal 36 of the crystal is connected to the input terminal 26 of the oscillator 22 and a terminal 38 of a capacitor 40. A second terminal 30 and 42 of the capacitors 30 and 40, respectively, is connected to ground. The mechanical resonance of the crystal 34 defines the frequency of the oscillator 22.

The microprocessor 20 is connected to a keyboard 54 having multiple keys 56, representing the keys 3, see FIG. 1. The keys 56 are connected to address terminals 58 of a microprocessor latch 60. The oscillator 22 is connected to latch 60 to provide the timing signal for the latch 60 so that the keys 56 are scanned almost continuously.

The multiple keys 56 on the keyboard 54 identify functions such as "volume up", "channel up", "volume down", etc. The latch 60 momentarily stores key data for the desired function pressed by the user. Random Access Memory (RAM) 62, connected to the latch, stores the key data for use by the microprocessor 20. Latch 60 is also connected to Read On Memory (ROM) 64 and an Arithmetic Logic Unit (ALU) 52.

The ALU 52 executes a sequence of commands based on a program and data stored in the ROM 64. The ROM data includes a lookup table containing the common operation mode signals "A", "B", and "C". The ALU 52 in response to keyed data stored in the RAM 62 reads the common operation mode signals from the ROM 64 and transfers the same out to the latch 60. The latch 60 outputs the common operation mode signals to an infrared drive circuit 70.

The drive circuit 70 includes a resistor 72 having a terminal 71 connected to a base 74 of a pnp transistor 76. A second terminal 77 of the resistor 72 is connected to the latch 60. An emitter 78 of the transistor 76 is connected to the voltage source 21. A collector 80 of the transistor 76 is connected to a terminal 81 of an infrared light emitting diode (LED) 82. A second terminal 83 of the LED 82 is connected to a terminal 84, a terminal 84. A second terminal 88 of the resistor 86 is connected to ground.

As illustrated in Table 1, each operation mode signal comprises a 12 bit signal transformed serially via the latch 60 to drive the LED 82. The resulting infrared signal is received and acted upon by a suitable receiver, such as the television sets 4, 5 and 6.

Figure 4:
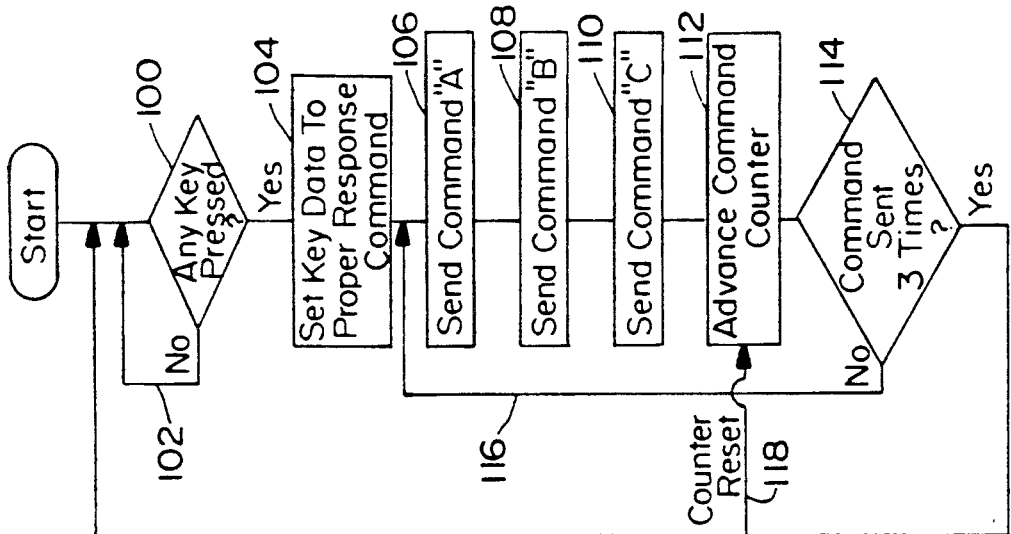
FIG. 4 is a flow diagram illustrating operation of a program implemented by the microprocessor of FIG. 3.

The operation of the microprocessor shown in FIG. 3 is illustrated in the block diagram of FIG. 4 described below. The microprocessor 20 continuously scans the buttons 56 on the keyboard 54 to determine if a user has depressed a button 56. The latch 60 momentarily stores key data when a key 56 has been pressed, as determined in a decision box 100. If a key has not been pressed, the microprocessor 20 waits until a key is pressed as shown by arrow 102. If a key has been pressed, the key data momentarily stored in the latch 60 is moved to RAM 62. The Key data in RAM 62 is used to address the look-up tables in ROM 64. Thus, the microprocessor 20 sets the key data to the proper response command, as shown in box 104. The ROM 64 stored common operation mode signal "A", "B" and "C" are sequentially sent to the latch 60. The ALU 52 sequentially sends operation mode signal "A", as shown in box 106, then operation mode signal "B", as shown in box 108, and finally operation mode signal "C", as shown in box 110. A command counter in ALU 52 is then advanced, as shown in box 112. The counter in the ALU 52 determines if commands "A", "B" and "C" have been sent three times, as determined in box 114. If they have not been sent three times, operation mode signal "A", "B" and "C" will be sent again as shown by arrow 116. The command counter in ALU 52 is then advanced as shown in box 112. Again, box 114 determines if the operation mode signals have been sent three times. If the operation mode signals "A", "B" and "C" have not been sent three times, they will be sent again as shown by arrow 116. Each operation mode signal is sent three times to ensure proper receipt by one of the television sets 4, 5 or 6. When the operation mode signals have been sent three times, the command counter in ALU 52 will be reset, as shown by arrow 118, and the microprocessor 20 will be ready for another key to be pressed as shown by arrow 120.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A wireless remote controller for controlling any one of a plurality of receiving devices each with a plurality of operation modes, comprising:

a plurality of operation mode selection keys for selecting a common operation mode for each receiving device;

a memory means responsive to a depressed operation mode selection key for storing the common operation mode signal for each receiving device for the depressed operation mode selection key;

a drive circuit for transmitting a signal to said receiving devices; and a control means coupled to said memory means and said drive circuit for obtaining the operation mode signal corresponding to the common operation mode of each receiving device from said memory means and for always outputting said operation mode signal for each of the plurality of receiving devices to said drive circuit in seriatim in response to the depressed operation mode selection key.

2. The wireless remote controller of claim 1 wherein the memory means includes a latch means coupled to said operation mode selection keys.

3. The wireless remote controller of claim 1 wherein the control means outputs the operation mode signal for each device to said drive circuit three times.

4. A wireless remote controller in accordance with claim 1, wherein each operation mode signal component for each said device corresponding to said depressed operation mode selection key includes a 12 bit code of binary high and low states.

5. A wireless remote controller in accordance with claim 4, wherein said high and low states are defined by longer and shorter time intervals, respectively.

6. A wireless remote controller in accordance with claim 5, wherein the operation mode signal includes identifying bits inserted between each said operation mode signal.

7. A wireless remote controller for controlling any one of a plurality of devices each with a plurality of operation modes, the remote controller having a plurality of operation mode selection keys for selecting the operation modes of the devices, a means for providing an operation mode signal in response to said selection keys being pressed, and a means for transmitting the operation mode signal to the device under control, the improvement comprising:

said operation mode signal includes one command signal for each of the devices, each said command signal corresponding to the selection key pressed;

said transmitting means transmits said one command signal for each device in seriatim in response to the selection key depressed only.

* * * * *